United States Patent
Chang et al.

(10) Patent No.: US 12,334,942 B2
(45) Date of Patent: Jun. 17, 2025

(54) PHASE LOCKED LOOP HAVING FAST LOCK FUNCTION

(71) Applicants: SILICON MITUS, INC., Seongnam-Si (KR); Hangzhou Silicon-Magic Semiconductor Technology Co., Ltd, Hangzhou (CN)

(72) Inventors: Young Jae Chang, Seoul (KR); Sung Ryong Lee, Seongnam-Si (KR); Jae Sam Shim, Seoul (KR)

(73) Assignees: SILICON MITUS, INC., Seongnam-Si (KR); Hangzhou Silicon-Magic Semiconductor Technology Co., Ltd, Hangzhou (CN)

( * ) Notice: Subject to any disclaimer, the term of this patent is extended or adjusted under 35 U.S.C. 154(b) by 37 days.

(21) Appl. No.: 18/425,818

(22) Filed: Jan. 29, 2024

(65) Prior Publication Data
US 2024/0388299 A1  Nov. 21, 2024

(30) Foreign Application Priority Data
May 18, 2023 (KR) .......................... 10-2023-0064415

(51) Int. Cl.
H03L 7/10 (2006.01)
H03L 7/085 (2006.01)
H03L 7/099 (2006.01)

(52) U.S. Cl.
CPC .............. H03L 7/104 (2013.01); H03L 7/085 (2013.01); H03L 7/099 (2013.01)

(58) Field of Classification Search
CPC . H03L 2207/06; H03L 2207/00; H03L 7/099; H03L 7/08
See application file for complete search history.

(56) References Cited

U.S. PATENT DOCUMENTS

| | | | |
|---|---|---|---|
| 6,016,080 A * | 1/2000 | Zuta | H03L 7/199 331/25 |
| 9,935,640 B1 * | 4/2018 | Chan | H03C 3/0991 |
| 10,291,389 B1 * | 5/2019 | Midha | H04L 5/0048 |

\* cited by examiner

*Primary Examiner* — Diana J. Cheng
(74) *Attorney, Agent, or Firm* — OSHA BERGMAN WATANABE & BURTON LLP

(57) ABSTRACT

A phase locked loop includes a main voltage-controlled oscillator for which an oscillation frequency is adjusted by an offset current and a control voltage (Vctrl), the offset current being set by an offset current setting code (VCO_CON), a phase frequency detector configured to adjust the control voltage by comparing an output signal (mCLK) of the main voltage-controlled oscillator and an input data signal (Data), and an offset current setter configured to generate the offset current setting code for setting the offset current of the main voltage-controlled oscillator. The offset current setter includes n sample voltage-controlled oscillators configured to generate n signals with different frequencies, respectively, and n counters configured to compare frequencies of each of the signals (sCLK) output from the n sample voltage-controlled oscillators and the input data signal, and is configured to generate the offset current setting code based on a comparison result of the n counters.

9 Claims, 7 Drawing Sheets

PHASE LOCKED LOOP HAVING FAST LOCK FUNCTION

CROSS-REFERENCE TO RELATED APPLICATION

This application claims priority to Korean Patent Application No. 2023-0064415 filed on May 18, 2023 and all the benefits accruing therefrom under 35 U.S.C. § 119, the contents of which are incorporated by reference in their entirety.

BACKGROUND

The present disclosure relates to a technology for reducing a lock time in a device that generates an output signal synchronized with a frequency and a phase of an input signal, such as a phase locked loop (PLL) or clock data recovery device (CDR).

A phase locked loop (PLL), a clock data recovery device (CDR), or the like, is a device that ensures that a frequency and phase of an output signal are synchronized with those of an input signal. The phase locked loop (PLL) may be understood as a general name for these devices, and a clock data recovery device (CDR) may be understood as a term mainly used when the input signal is a clock data signal, which is a type of phase locked loop (PLL). In the present specification, even when a device is referred to as a phase locked loop (PLL), a clock data recovery device (CDR), or another name, the device that ensures that the frequency and the phase of the output signal are synchronized with those of the input signal are collectively referred to as a phase locked loop (PLL).

The time it takes for an output signal to be synchronized with the frequency and phase of an input data signal and locked after the input data signal has been received in the phase locked loop (PLL) is called a lock time. When the lock time is long, the time it takes to initially receive the input data signal from the outside becomes longer. This means that a preparation time for the phase locked loop (PLL) to output a target frequency and a phase signal becomes longer, and thus it is necessary to minimize the lock time.

In addition, as an operating frequency range of the phase locked loop (PLL) becomes wider, a frequency range over which a voltage-controlled oscillator (VCO) inside the phase locked loop (PLL) has to operate becomes wider. In this case, it takes a long time for a control voltage (Vctrl), which controls an oscillation frequency of the voltage-controlled oscillator (VCO), to reach a target value, thereby further lengthening the lock time.

If the input signal is not applied long enough until the phase locked loop (PLL) is locked, there may be issues in the operation of the phase locked loop (PLL), and as a consequence, if the lock time of the phase locked loop (PLL) is long, the speed of the entire device slows down.

SUMMARY

The present disclosure provides a phase locked loop (PLL) capable of reducing a lock time.

In accordance with one or more embodiments of the present disclosure, a phase locked loop includes a main voltage-controlled oscillator for which an oscillation frequency is adjusted by an offset current and a control voltage (Vctrl), the offset current being set by an offset current setting code (VCO_CON), a phase frequency detector configured to adjust the control voltage by comparing an output signal (mCLK) of the main voltage-controlled oscillator and an input data signal (Data), and an offset current setter configured to generate the offset current setting code for setting the offset current of the main voltage-controlled oscillator, in which the offset current setter includes n sample voltage-controlled oscillators configured to generate n signals with different frequencies, respectively, and n counters configured to compare frequencies of each of the signals (sCLK) output from the n sample voltage-controlled oscillators and the input data signal, and is configured to generate the offset current setting code based on a comparison result of the n counters.

In the phase locked loop, the offset current setter may generate the offset current setting code so that the offset current of the main voltage-controlled oscillator is substantially same as an offset current of a reference sample voltage-controlled oscillator, and the reference sample voltage-controlled oscillator may be a sample voltage-controlled oscillator having a frequency lower than and closest to the frequency of the input data signal among the n sample voltage-controlled oscillators.

In the phase locked loop, an oscillation frequency of each of the n sample voltage-controlled oscillators may be adjusted by an offset current and a control voltage, a same control voltage of the main voltage-controlled oscillator may be applied to the n sample voltage-controlled oscillators, and the offset current of each of the n sample voltage-controlled oscillators may be set to a different value so that each of the n sample voltage-controlled oscillators oscillates at a different frequency.

In the phase locked loop, respective offset currents of the n sample voltage-controlled oscillators may be determined by preset n sample offset current setting codes (sVCO_CON), and the offset current setting code (VCO_CON) of the main voltage-controlled oscillator may be set to the same value as the sample offset current setting code of the reference sample voltage-controlled oscillator, so that the offset current of the main voltage-controlled oscillator is set to a value substantially equal to the offset current of the reference sample voltage-controlled oscillator.

In the phase locked loop, the offset current setting code and the sample offset current setting code may be n-bit codes.

In the phase locked loop, each of the n counters may count in synchronization with the output signal (sCLK) of a corresponding sample voltage-controlled oscillator, and may be reset by a signal obtained by dividing the input data signal by $2^{n-1}$.

In the phase locked loop, each of the n counters may output an output value that is low or high depending on whether a count of $2^{n-1}$ is completed before being reset by a signal obtained by dividing the input data signal by $2^{n-1}$, and the offset current setting code may be an n-bit code determined by the n output values output from the n counters. In the phase locked loop, the main voltage-controlled oscillator and each of the n sample voltage-controlled oscillators may include n offset current sources and n offset current sinks, the n offset current sources and the n offset current sinks may each be controlled to be turned on and off by corresponding switches, and corresponding pairs of the n offset current sources and the n offset current sinks may be controlled to be turned on and off by a same signal.

In the phase locked loop, the n offset current sources and the n offset current sinks of the main voltage-controlled oscillator may be controlled to be turned on and off by respective bits of the n-bit offset current setting code (VCO_CON).

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
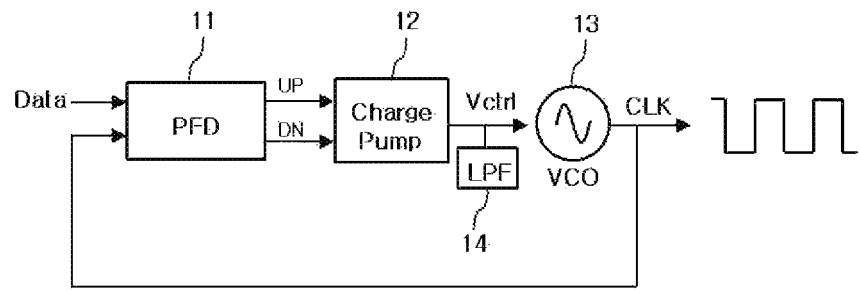
FIG. 1 is a diagram conceptually describing a basic structure of a phase locked loop in accordance with one or more embodiments of the present disclosure.

Hereinafter, some embodiments of the present disclosure will be described in detail with reference to exemplary drawings. In adding reference numerals to the components of each drawing, it should be noted that the same components are given the same reference numerals as much as possible even though they are shown on different drawings. Furthermore, in the description of the present disclosure, if it is determined that the detailed description of the known technology related to the present disclosure may unnecessarily obscure the subject matter of the present disclosure, the detailed description thereof will be omitted.

In addition, in describing a component of the present disclosure, terms such as first, second, A, B, (a), (b), etc. may be used. These terms are only for distinguishing the component from other components, and the essence, sequence, or order of the component is not limited by the terms. When a component is described as being "connected", "coupled" or "linked" to another component, it should be understood that the component may be directly connected to or linked to the other component, or yet another component may be "connected," "coupled," or "linked" between the components.

FIG. 1 briefly conceptually illustrates a basic structure of a phase locked loop 10. The phase locked loop 10 may receive an input data signal Data and generate an output signal CLK whose frequency and phase are synchronized with the input data signal Data.

In one or more embodiments, the phase locked loop 10 may selectively include a phase frequency detector (PFD) 11, a charge pump 12, a voltage-controlled oscillator (VCO) 13, and a filter (low-pass filter (LPF)) 14.

The phase frequency detector 11 may control a control voltage Vctrl by comparing frequencies and phases of the output signal CLK and the input data signal Data. In one or more embodiments, the phase frequency detector 11 may output an up signal UP or a down signal DN based on the comparison result of the frequencies and phases of the output signal CLK and the input data signal Data. For example, when the frequency of the output signal CLK is higher than the frequency of the input data signal Data, the down signal DN may be output, and in the opposite case, the up signal UP may be output.

The charge pump 12 may increase or decrease the control voltage Vctrl according to the output signal of the phase frequency detector 11. For example, when the output signal of the phase frequency detector 11 is the up signal UP, the control voltage Vctrl may be increased, and when the output signal of the phase frequency detector 11 is the down signal DN, the control voltage Vctrl may be decreased.

The voltage-controlled oscillator (VCO) 13 may adjust the oscillation frequency of the output signal CLK according to the control voltage Vctrl. For example, when the control voltage Vctrl increases, the frequency of the output signal CLK may be increased, and when the control voltage Vctrl decreases, the frequency of the output signal CLK may be decreased.

The filter (LPF) 14 may be selectively used as needed to reduce a high-frequency component of the control voltage Vctrl.

Figure 2:
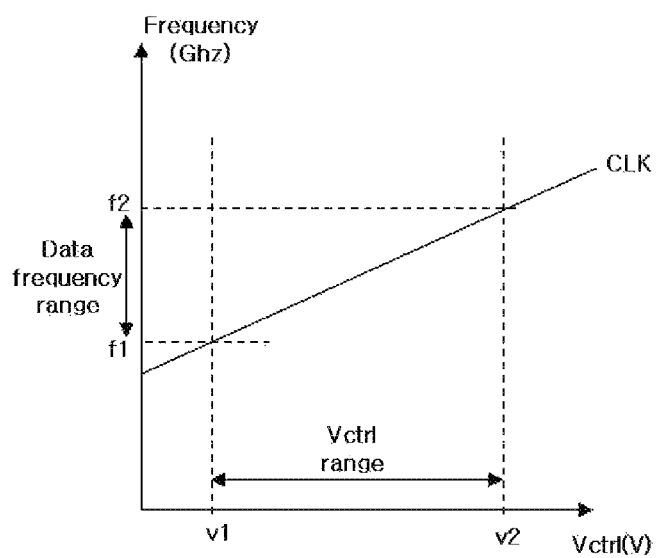
FIG. 2 is a diagram illustrating a relationship between an operating frequency range of the phase locked loop illustrated in FIG. 1 and a control voltage (Vctrl) in accordance with one or more embodiments of the present disclosure.

The operation of the phase locked loop 10 configured as described above will be described with reference to FIG. 2. FIG. 2 is a diagram illustrating a relationship between an operating frequency range of the phase locked loop 10 illustrated in FIG. 1 and the control voltage Vctrl.

In the phase locked loop 10, the voltage-controlled oscillator 13 may vary the frequency of the output signal CLK according to the control voltage Vctrl. In FIG. 2, the frequency of the output signal CLK is illustrated as being proportional to the control voltage Vctrl, but the relationship between the frequency of the output signal CLK and the control voltage Vctrl may be set in various ways.

Assuming that the frequency range of the input data signal Data in which the phase locked loop 10 is able to operate is a range between f1 and f2 as illustrated in FIG. 2, an operating range of the control voltage Vctrl may be v1 to v2. Since the frequency of the input data signal Data may be an arbitrary value between f1 and f2, the control voltage Vctrl has to be found to be an appropriate value corresponding to the frequency of the input data signal Data.

In one or more embodiments, when the frequency of the output signal CLK is higher than the frequency of the input data signal Data, the phase frequency detector 11 may output the down signal DN, and accordingly the control voltage Vctrl may be lowered, so the frequency of the output signal CLK may be lowered. Conversely, when the frequency of the output signal CLK is lower than the frequency of the input data signal Data, the phase frequency detector 11 may output the up signal UP, and accordingly the control voltage Vctrl may be increased, so the frequency of the output signal CLK may be increased. In this way, the frequencies and phases of the output signal CLK and the input data signal Data may be synchronized with each other via the control voltage Vctrl.

Assuming that an initial value of the control voltage Vctrl is v1 and the frequency of the input data signal Data is f2, the control voltage Vctrl may start from v1, which is the initial value, and move to v2, which is the value corresponding to the frequency f2 of the input data signal Data. In this way, the time it takes for the control voltage Vctrl to move from the initial value to a final value at which the output signal is synchronized with the input data signal Data is called the lock time, and a state in which the control voltage Vctrl operates while being stably fixed to the final value at which the output signal is synchronized with the input data signal Data is called a lock state. In that the input data signal Data has to be applied longer than the lock time of the phase locked loop 10 for the phase locked loop 10 to normally operate, the lock time of the phase locked loop 10 may have a great effect on the operating speed of the device.

The lock time of the phase locked loop 10 may be affected by the frequency range f1 to f2 of the input data signal Data and the operating range v1 to v2 of the control voltage Vctrl. As the operating frequency range of the phase locked loop 10 gradually widens, the operating range of the control voltage Vctrl also widens, and thus reducing the lock time of the phase locked loop 10 is one of the technical challenges to be faced. Currently, in the case of a phase locked loop 10 with general performance, the lock time is approximately several thousand cycles of the input data signal Data. That is, in that the input data signal Data has to be repeated for several thousand cycles in order for the control voltage Vctrl of the phase locked loop 10 to operate while being stably fixed to the final value at which the output signal is synchronized with the input data signal Data, there is a need for improvement. The present disclosure provides increased operation speed of the device by reducing the lock time of the phase locked loop 10.

Figure 3:
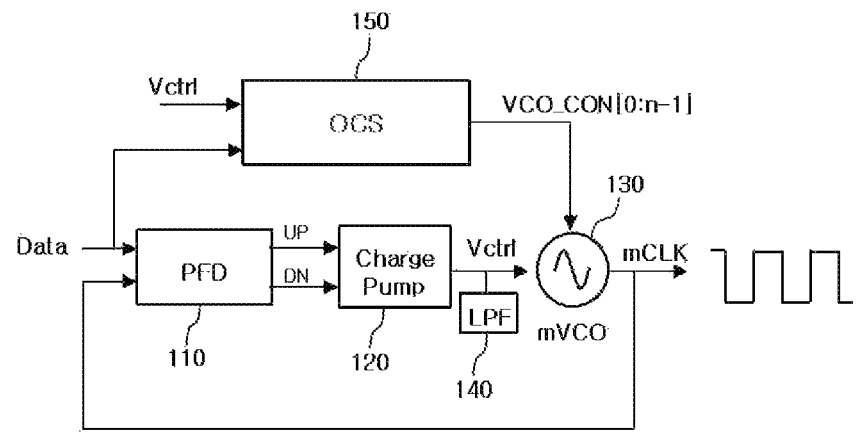
FIG. 3 is a diagram illustrating a phase locked loop in accordance with one or more embodiments of the present disclosure.
Figure 4:
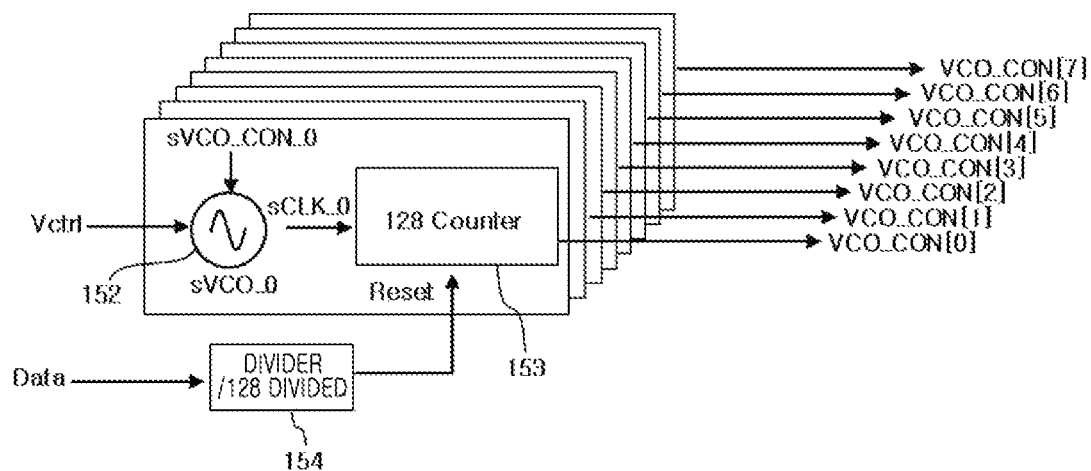
FIG. 4 illustrates an offset current setter in accordance with one or more embodiments of the present disclosure capable of being used in the phase locked loop of FIG. 3.

FIG. 3 is a diagram illustrating a phase locked loop 100 in accordance with one or more embodiments of the present disclosure, and FIG. 4 illustrates one or more embodiments of an offset current setter 150 capable of being used in the phase locked loop 100 of FIG. 3.

The phase locked loop 100 in accordance with one or more embodiments of the present disclosure, which is illustrated in FIG. 3, may receive an input data signal Data and generate an output signal mCLK whose frequency and phase are synchronized with the input data signal Data. In one or more embodiments, the phase locked loop 100 may selectively include a phase frequency detector 110, a charge pump 120, a main voltage-controlled oscillator 130, a filter 140, and an offset current setter 150.

An oscillation frequency of the main voltage-controlled oscillator 130 may be adjusted by an offset current and a control voltage Vctrl. A value of the offset current may be set by an offset current setting code VCO_CON[0:n−1] output by the offset current setter 150.

The phase frequency detector 110 may adjust the control voltage Vctrl by comparing frequencies and phases of the output signal mCLK of the main voltage-controlled oscillator 130 and the input data signal Data. Since the phase frequency detector 110, charge pump 120, and filter 140 are similar to the phase frequency detector 11, charge pump 12, and filter 14 described with reference to FIG. 1, redundant descriptions thereof will be omitted.

The offset current setter 150 may generate the offset current setting code VCO_CON[0: n−1] for setting an offset current of the main voltage-controlled oscillator 130. In one or more embodiments, as illustrated in FIG. 4, the offset current setter 150 may include n sample voltage-controlled oscillators 152 (sVCO_0 to sVCO_n, hereinafter referred to as sVCO_i) for generating n signals each having different frequencies and n counters 153 for comparing frequencies of each of the signals sCLK_0 to sCLK_n (hereinafter referred to as sCLK_i) output by the n sample voltage-controlled oscillators 152 and the input data signal Data. The offset current setter 150 may generate the offset current setting code VCO_CON[0:n−1] based on a comparison result of the n counters 153.

In FIG. 4, the offset current setter 150 is illustrated as including eight sample voltage-controlled oscillators 152 and eight counters 153, but the number of sample voltage-controlled oscillators 152 and counters 153 may be set to a number other than eight. However, the number of sample voltage-controlled oscillators 152 and counters 153 may be the same. That is, the sample voltage-controlled oscillators 152 and the counters 153 may operate in a one-to-one correspondence. Additionally, each bit of the offset current setting code VCO_CON[0:n−1] may be generated corresponding to the output value of each corresponding counter 153. That is, the number of counters 153 and the number of bits of the offset current setting code VCO_CON[0:n−1] may be the same.

Each of the n counters 153 may count in synchronization with the output signal sCLK_i of the corresponding sample voltage-controlled oscillator 152, and may be reset by a signal obtained by dividing the input data signal Data by $2^{n-1}$. Each of the n counters 153 may output "low" or "high" depending on whether a count of $2^{n-1}$ is completed before being reset by the signal obtained by dividing the input data signal Data by $2^{n-1}$. For example, when the count of $2^{n-1}$ is completed before the n counter 153 is reset by the signal obtained by dividing the input data signal Data by $2^{n-1}$, the n counter 153 may output "low", and when the count of $2^{n-1}$ is not completed before the n counter 153 is reset by the signal obtained by dividing the input data signal Data by $2^{n-1}$, the n counter 153 may output "high". The offset current setting code VCO_CON[0:n−1] may be an n-bit code determined by n output values output by the n counters 153.

The operation of the offset current setter 150 will be described in more detail with reference to FIG. 4.

The eight sample voltage-controlled oscillators 152 may output eight sample clocks sCLK_i of different frequencies. The eight sample voltage-controlled oscillators 152 are denoted as sVCO_0 to sVCO_7, and signals output from the respective sample voltage-controlled oscillators 152 are denoted as sCLK_0 to sCLK_7.

Each sample voltage-controlled oscillator 152 may commonly receive the control voltage Vctrl. The control voltage Vctrl may be the same signal as the control voltage Vctrl used to adjust the frequency of the main voltage-controlled oscillator 130. In addition, the offset current of each of the sample voltage-controlled oscillators 152 may be adjusted by a corresponding sample offset current setting code sVCO_CON_0 to sVCO_CON_7 (hereinafter referred to as sVCO_CON_i).

That is, the eight sample voltage-controlled oscillators 152 are provided with the common control voltage Vctrl, but may oscillate at different frequencies by setting the offset currents by the sample offset current setting codes sVCO_CON_i different from each other. Accordingly, the eight output signals sCLK_0 to sCLK_7 output by the eight sample voltage-controlled oscillators 152 may have different frequencies for the same control voltage Vctrl (see FIG. 5). For example, the frequencies of the eight output signals sCLK_0 to sCLK_7 output by the eight sample voltage-controlled oscillators 152 may be arranged at predetermined intervals from each other in the operating frequency range of the main voltage-controlled oscillator 130.

A divider 154 may output a signal obtained by dividing the input data signal Data by $2^{n-1}$. For example, when n=8, the divider 154 may output a signal obtained by dividing the input data signal Data by 128 (that is, a signal with 128 times more cycles).

All the eight counters 153 may be reset using the same output signal of the divider 154. That is, all the eight counters 153 may be reset simultaneously once every 128 cycles of the input data signal Data.

Each of the eight counters 153 may perform counting in synchronization with the output signal sCLK_i of a corresponding sample voltage-controlled oscillator 152, output low when the count of 128 is completed before reset, and output low when the count of 128 is not completed. Here, low and high are examples to describe an operating principle and different way may be implemented while the same principle is used.

Through this operation, each counter 153 may eventually perform a function of comparing the frequency of the output signal sCLK_i of the corresponding sample voltage-controlled oscillator 152 and the frequency of the input data signal Data. For example, when the frequency of the output signal sCLK_i of the sample voltage-controlled oscillator 152 is higher than the frequency of the input data signal Data (that is, when the period is short), the count of 128 may be completed before the counter 153 is reset, and when the frequency of the output signal sCLK_i of the sample voltage-controlled oscillator 152 is lower than the frequency of the input data signal Data (that is, when the period is long), the count of 128 may not be completed before the counter 153 is reset. Accordingly, the output signal of each of the eight counters 153 has information on whether the frequency of the output signal sCLK_i of the corresponding sample voltage-controlled oscillator 152 is higher or lower than the frequency of the input data signal Data.

The output signal of each of the 8 counters 153 may be used to generate the offset current setting code VCO_CON [0:7]. For example, the respective output signals of the eight counters 153 may sequentially determine values of bits of the offset current setting code VCO_CON. For example, an output signal of a first counter 153 may determine a first bit VCO_CON[0] of the offset current setting code, and an output signal of a last counter 153 may determine a last bit VCO_CON[7] of the offset current setting code. The offset current setting code VCO_CON generated in this way may be used to set the offset current of the main voltage-controlled oscillator mVCO.

Figure 5:
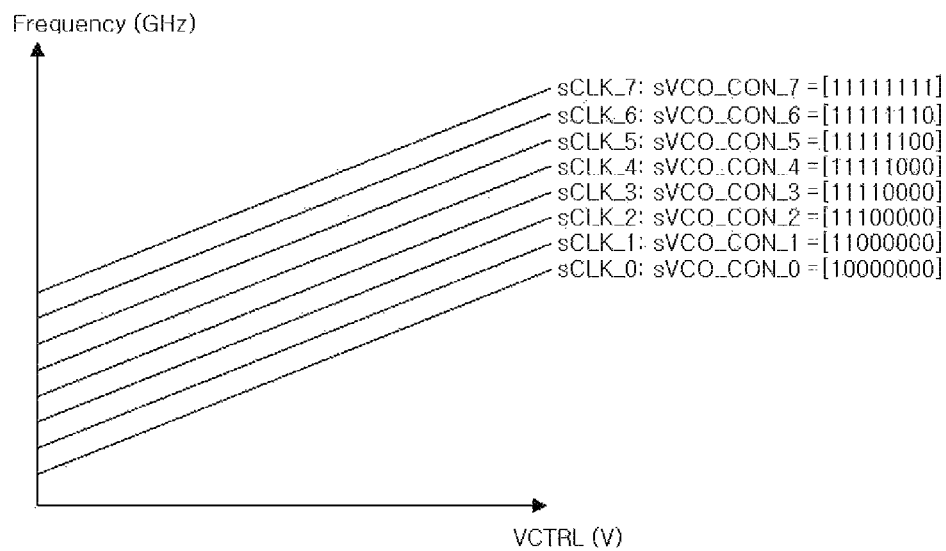
FIGS. 5 to 7 are diagrams for operations of the offset current setter illustrated in FIG. 4 in accordance with one or more embodiments of the present disclosure.
Figure 6:
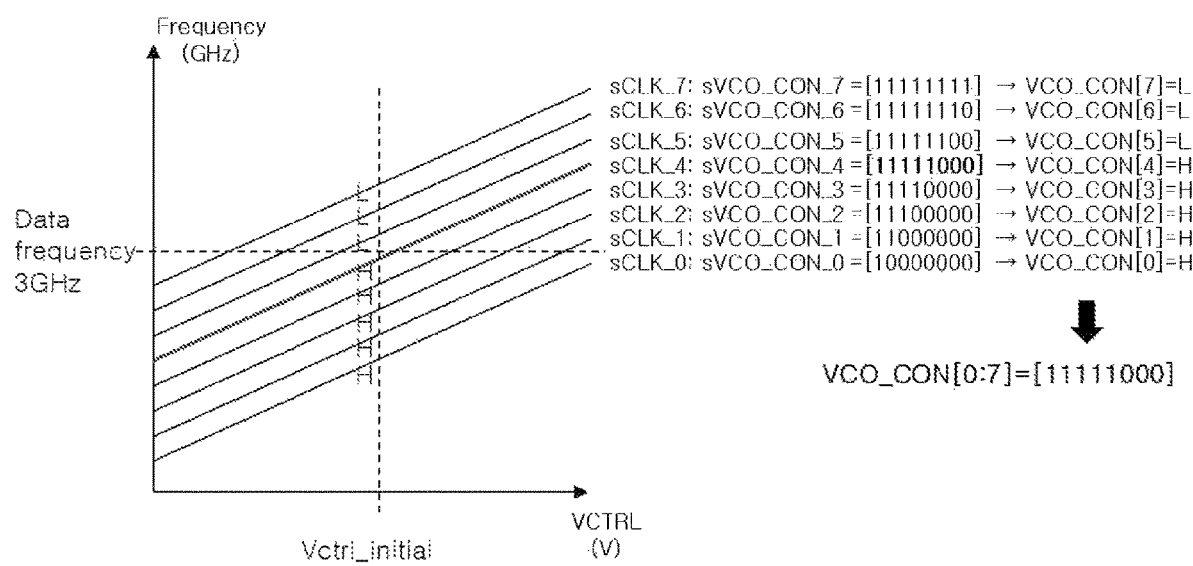
Figure 7:
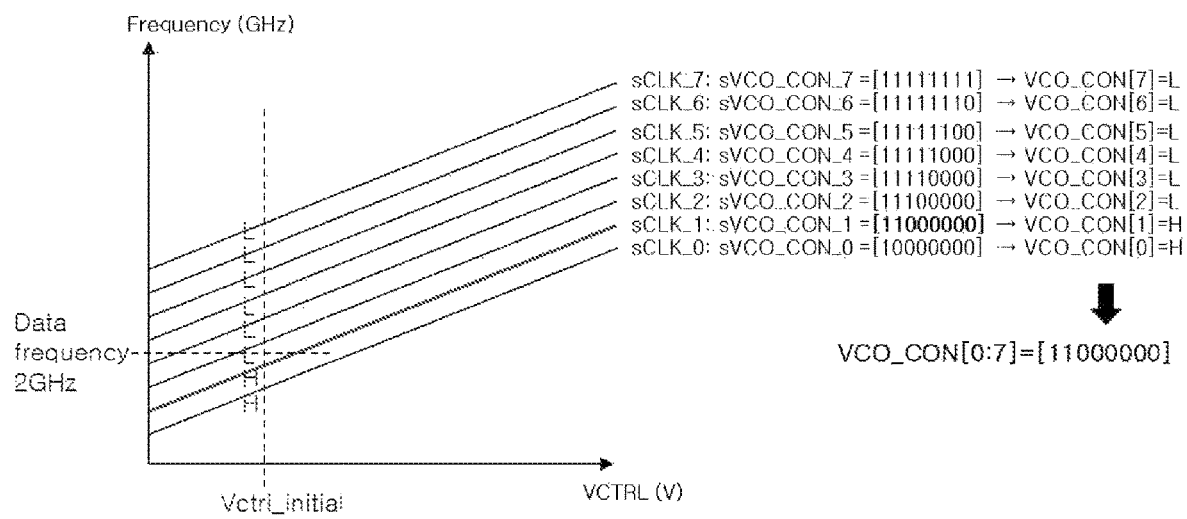

FIGS. 5 to 7 illustrate operation of the offset current setter 150 illustrated in FIG. 4. FIGS. 5 to 7 illustrate a case where the eight sample voltage-controlled oscillators 152 and the eight counters 153 are used.

First, FIG. 5 illustrates the relationship between the control voltage Vctrl and the frequency for eight output signals sCLK_i output by the eight sample voltage-controlled oscillators 152.

As described above, even though the control voltage Vctrl applied to the eight sample voltage-controlled oscillators 152 is the same, the sample offset current setting codes sVCO_CON_i for setting the offset currents of the eight sample voltage-controlled oscillators 152 are different from each other, and thus the frequencies thereof may be different from each other. In FIG. 5, the eight sample offset current setting codes sVCO_CON_i are [10000000], [11000000], [11100000], [11110000], [11111000], [11111100], [11111110], and [11111111] in that order.

FIGS. 6 and 7 are diagrams illustrating a process in which the offset current setter 150 generates the offset current setting code VCO_CON to be used to set the offset current of the main voltage-controlled oscillator 130.

In FIG. 6, it is assumed that the frequency of the input data signal Data is 3 GHZ. "Vctrl_initial" shown in the drawing means the initial value of the control voltage Vctrl. That is, the same initial value Vctrl_initial of the control voltage of the main voltage-controlled oscillator 130 may be applied to the eight sample voltage-controlled oscillators 152 to start a synchronization process.

When the same initial value Vctrl_initial of the control voltage is applied to all the eight sample voltage-controlled oscillators 152, due to differences in the sample offset current setting codes sVCO_CON_i, the frequencies of the output signals sCLK_0 to sCLK_7 output by the eight sample voltage-controlled oscillators 152 all vary. FIG. 6 illustrates a case in which, among them, five output signals sCLK_0 to sCLK_4 are lower than 3 GHz, which is the frequency of the input data signal Data, and the remaining three output signals sCLK_5 to sCLK_7 are higher than 3 GHz, which is the frequency of the input data signal Data.

As described above, each of the eight counters 153 may output a result of comparing the frequency of the output signal sCLK_i of the corresponding sample voltage-controlled oscillator 152 and the frequency of the input data signal Data. FIG. 6 illustrates that "low (L)" is output when the frequency of the output signal sCLK_i of the sample voltage-controlled oscillator 152 is higher than the frequency of the input data signal Data. In this case, the counters 153 corresponding to the five output signals sCLK_0 to sCLK_4 lower than the frequency of the input data signal Data may output "high (H)", and the counters 153 corresponding to the remaining three output signals sCLK_5 to sCLK_7 may output "low (L)".

Output values of the eight counters 153 corresponding to the eight output signals sCLK_0 to sCLK_7 may constitute the offset current setting code VCO_CON[0:7] in respective bits in that order. For example, a method may be used in which "high (H)", which is the output value of the counter 153 corresponding to an output signal sCLK_0 of a first sample voltage-controlled oscillator sVCO_0, becomes the first bit VCO_CON[0] of the offset current setting code VCO_CON[0:7], and "high (H)", which is the output value of the counter 153 corresponding to an output signal sCLK_1 of a second sample voltage-controlled oscillator sVCO_1, becomes a second bit VCO_CON[1] of the offset current setting code VCO_CON[0:7].

The offset current setting code VCO_CON[0:7] constituted in this way may be the same as the sample offset current setting code sVCO_CON of the sample voltage-controlled oscillator 152 having a frequency lower than and closest to the frequency of the input data signal Data, among the eight sample voltage-controlled oscillators 152. Hereinafter, among the n sample voltage-controlled oscillators 152, the sample voltage-controlled oscillator 152 having the frequency lower than and closest to the frequency of the input data signal Data will be referred as a "reference sample voltage-controlled oscillator".

Specifically, in FIG. 6, when the frequency of the input data signal Data is 3 GHz, the frequency of the input data signal Data is higher than the output signal sCLK_4 of the fifth sample voltage-controlled oscillator sVCO_4, but is lower than the output signal sCLK_5 of the sixth sample voltage-controlled oscillator sVCO_5 (at the initial value Vctrl_initial of the control voltage). In this case, the reference sample voltage-controlled oscillator 152 is the fifth sample voltage-controlled oscillator sVCO_4. A sample offset current setting code sVCO_CON_4 of the fifth sample voltage-controlled oscillator sVCO_4 is [11111000], which is the same as the offset current setting code VCO_CON constituted in the way described above.

Next, with reference to FIG. 7, one or more embodiments in which the frequency of the input data signal Data and the initial value Vctrl_initial of the control voltage have different values will be described.

When the frequency of the input data signal Data illustrated in FIG. 7 is the initial value of the control voltage, the frequency of the input data signal Data is higher than the output signal sCLK_1 of the second sample voltage-controlled oscillator sVCO_1, but is lower than the output signal sCLK_2 of the third sample voltage-controlled oscillator sVCO_2. That is, the reference sample voltage-controlled oscillator 152 is the second sample voltage-controlled oscillator sVCO_1.

In this case, the counters 153 corresponding to the first and second sample voltage-controlled oscillators sVCO_0 and sVCO_1 may output "high (H)", and the counters 153 corresponding to the remaining sample voltage-controlled oscillators sVCO_2 to sVCO_7 may output "low (L)". As a result, the offset current setting code VCO_CON becomes [11000000], which is the same value as the sample offset current setting code sVCO_CON_1 of the second sample voltage-controlled oscillator sVCO_1, which is the reference sample voltage-controlled oscillator 152. That is, in the example of FIG. 7, the offset current setting code VCO_CON output by the offset current setter 150 is the same as the sample offset current setting code sVCO_CON_1 of the second sample voltage-controlled oscillator sVCO_1, and the frequency of the second sample voltage-controlled oscillator sVCO_1 is a frequency lower than and closest to the frequency of the input data signal Data.

As described above, the offset current setter 150 of one or more embodiments may output the sample offset current setting code sVCO_CON_i of the reference sample voltage-controlled oscillator 152 having a frequency that is lower than and closest to the frequency of the input data signal Data, among the plurality of sample voltage-controlled oscillators 152 set to have different frequencies depending on the offset current setting values for the same control voltage Vctrl. The main voltage-controlled oscillator 130 may set the offset current by using this code. When a design is done so that the offset current of the main voltage-controlled oscillator 130 and the offset current of the sample voltage-controlled oscillator 152 are set in the same way (that is, when the design is done so that the same magnitude of offset currents flow by the same offset current setting code), the main voltage-controlled oscillator 130 may set the offset current using the offset current setting code VCO_CON provided by the offset current setter 150 to start frequency synchronization in a state of being close to the frequency of the input data signal Data, thereby reducing the lock time.

The time required to set the offset current of the main voltage-controlled oscillator 130 in this way is the time required for the counters 153 to determine the output values, meaning the time in which the cycle of the input data signal Data is repeated $2^{n-1}$ times. For example, when n=8, the main voltage-controlled oscillator 130 may complete the setting of the offset current so that the frequency is close to the input data signal Data when the cycle of the input data signal Data is repeated 128 times, and from this point in time on, frequency synchronization may proceed through adjustment of the control voltage Vctrl. Considering that in the case of the phase locked loop 10 with general performance, the lock time is approximately several thousand cycles of the input data signal Data, in one or more embodiments, the phase locked loop may operate at a frequency close to the input data signal Data in 128 cycles of the input data signal Data, and thus the lock time may be greatly improved.

That is, when the offset current of the main voltage-controlled oscillator 130 is set using the offset current setter 150 in accordance with one or more embodiments, frequency synchronization may be started in the state of being close to the frequency of the input data signal Data, and thus, a movement range for the control voltage Vctrl to reach a target value is reduced, so that the control voltage Vctrl quickly reaches the target value and the lock time is reduced accordingly.

One or more embodiments where there are eight sample voltage-controlled oscillators 152 have been described through FIGS. 5 to 7, but the number of sample voltage-controlled oscillators 152 may be set in various ways as needed. When more sample voltage-controlled oscillators 152 are used, frequency gaps between the sample voltage-controlled oscillators 152 may be reduced, so that the main voltage-controlled oscillator 130 may start frequency synchronization in the state of being closer to the frequency of the input data signal Data, and thus the lock time may be reduced. On the other hand, when more sample voltage-controlled oscillators 152 are used, the circuit configuration becomes more complicated due to the addition of the sample voltage-controlled oscillators 152. The design may be done so that the number of sample voltage-controlled oscillators 152 is appropriate considering the above-mentioned advantages and disadvantages. However, the sample voltage-controlled oscillator 152 used in one or more embodiments does not require a buffer and the like, and therefore does not occupy a large area on a semiconductor substrate compared to a general voltage-controlled oscillator, and accordingly, there is not much burden on the design due to the addition of the sample voltage-controlled oscillators 152. Additionally, since the sample voltage-controlled oscillator 152 used in one or more embodiments may operate only during the offset current setting process at the beginning of the operation of the main voltage-controlled oscillator 130 and be turned off thereafter, there is little additional power consumption. Considering the lock time specifications required for the phase locked loop (PLL), it may be desirable to use as many as eight sample voltage-controlled oscillators.

In summary, the offset current setter 150 may generate the offset current setting code VCO_CON of the main voltage-controlled oscillator mVCO so that the offset current of the main voltage-controlled oscillator mVCO is substantially the same as the offset current of the reference sample voltage-controlled oscillator sVCO having a frequency lower than and closest to the frequency of the input data signal Data, among the sample voltage-controlled oscillators sVCO. In one or more embodiments, the offset current setting code VCO_CON of the main voltage-controlled oscillator mVCO may be the same as the offset current setting code sVCO_CON of the reference sample voltage-controlled oscillator sVCO.

Figure 8:
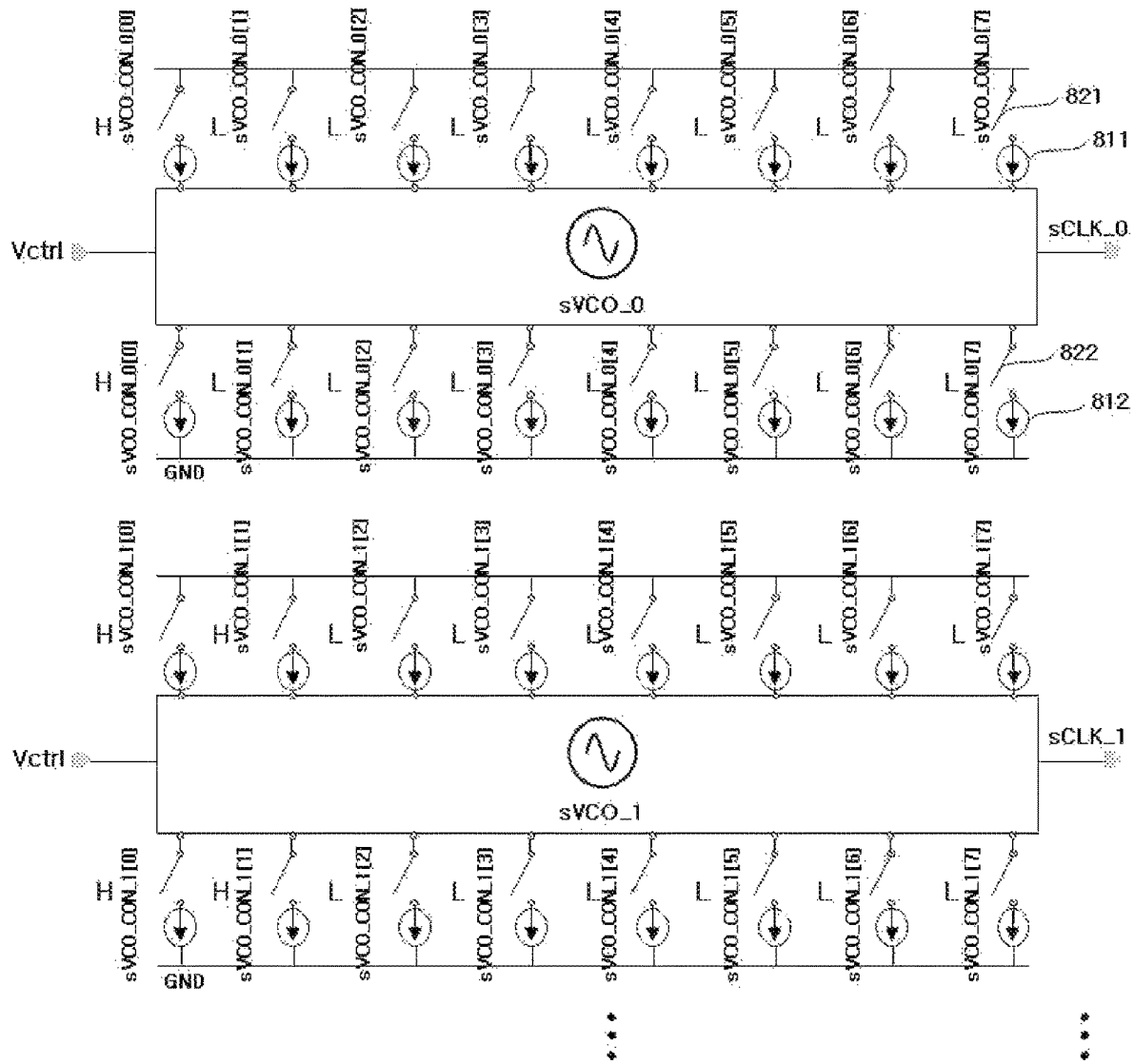
FIG. 8 shows offset current setting structures of a sample voltage-controlled oscillators (sVCO) in accordance with one or more embodiments of the present disclosure.
Figure 9:
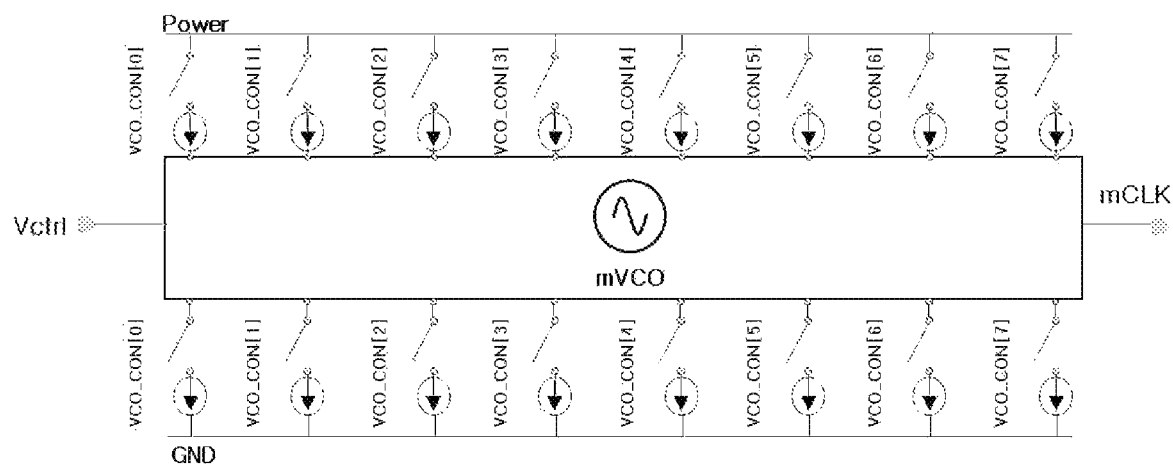
FIG. 9 shows an offset current setting structure of a main voltage-controlled oscillator (mVCO) in accordance with one or more embodiments of the present disclosure.

FIG. 8 shows offset current setting structures of the sample voltage-controlled oscillators sVCO_i, and FIG. 9 shows an offset current setting structure of the main voltage-controlled oscillator mVCO.

In FIG. 8, two sample voltage-controlled oscillators sVCO_0 and sVCO_1 are shown and the remaining sample voltage-controlled oscillators are omitted. The frequency of the output signal sCLK_i of each sample voltage-controlled oscillator sVCO_i may be adjusted according to the control voltage Vctrl and the offset current. The same control voltage Vctrl of the main voltage-controlled oscillator mVCO may be applied to each of the sample voltage-controlled oscillators sVCO_i. The offset current of each of the sample voltage-controlled oscillators sVCO_i is set to different values by the corresponding sample offset current setting code sVCO_CON_i, so that the n sample voltage-controlled oscillators sVCO_i may oscillate at frequencies different from each other.

Specifically, in order to adjust the offset currents of the sample voltage-controlled oscillators sVCO_i, each of the sample voltage-controlled oscillators sVCO_i may include n offset current sources 811 and n offset current sinks 812. The n offset current sources 811 and n offset current sinks 812 may be controlled to be turned on and off by corresponding switches 821 and 822, respectively. Corresponding pairs of the n offset current sources 811 and n offset current sinks 812 may be controlled to be turned on and off by the same signal. That is, the n offset current sources 811 and the n offset current sinks 812 corresponding to one of the sample voltage-controlled oscillators sVCO_i may be formed into n pairs and controlled to be turned on and off by n-bit sample offset current setting codes sVCO_CON_i.

The offset current setting structures of the sample voltage-controlled oscillators sVCO_i may all be substantially the same. That is, when the same sample offset current setting code sVCO_CON_i is applied to different sample voltage-controlled oscillators sVCO_i, the same offset current may be generated. However, since the sample offset current setting code sVCO_CON_i corresponding to each of the sample voltage-controlled oscillators sVCO_i is set differently, the n sample voltage-controlled oscillators sVCO_i may each oscillate at different frequencies.

FIG. 8 illustrates a case of n=8, where the offset current setting code of the first sample voltage-controlled oscillator sVCO_0 is [10000000], and as a result, the first offset current source and offset current sink from the left are turned on, and the remaining offset current sources and offset current sinks are turned off. The offset current setting code of the second sample voltage-controlled oscillator sVCO_1 is [11000000], and as a result, the first and second offset current sources and offset current sinks from the left are turned on, and the remaining offset current sources and offset current sinks are turned off. In this way, the offset current setting code of the last sample voltage-controlled oscillator sVCO_7 is [11111111], which allows all offset current sources and offset current sinks to be turned on.

The current magnitudes of the n offset current sources 811 and offset current sinks 812 may be appropriately adjusted to set each of the frequencies of the n sample voltage-controlled oscillators sVCO_i to a desired value. For example, when the current magnitudes of the n offset current sources 811 and the n offset current sinks 812 are all set to be the same, the offset current may be proportional to the number of the offset current sources 811 and the offset current sinks 812 that are turned on.

Next, referring to FIG. 9, the offset current setting structure of the main voltage-controlled oscillator mVCO may be substantially the same as the offset current setting structure of the sample voltage-controlled oscillator sVCO_i. That is, when the same offset current setting code is applied to the main voltage-controlled oscillator mVCO and the sample voltage-controlled oscillator sVCO_i, the offset current of the same size may be generated.

Specifically, the main voltage-controlled oscillator mVCO may include n offset current sources and n offset current sinks, the n offset current sources and the n offset current sinks may each be controlled to be turned on and off by corresponding switches, and corresponding pairs of the n offset current sources and the n offset current sinks may be controlled to be turned on and off by the same signal. FIG. 9 illustrates a case where n=8.

The n offset current sources and the n offset current sinks of the main voltage-controlled oscillator mVCO may be controlled to be turned on and off by respective bits of the offset current setting code VCO_CON constituted by n bits. The offset current setting code VCO_CON of the main voltage-controlled oscillator mVCO may be set to the same value of the sample offset current setting code sVCO_CON of the sample voltage-controlled oscillator (the reference sample voltage-controlled oscillator) having the frequency lower than and closest to the frequency of the input data signal, so that the offset current of the main voltage-controlled oscillator mVCO may be substantially the same as the offset current of the reference sample voltage-controlled oscillator. In one or more embodiments, the offset current source and the offset current sink of the main voltage-controlled oscillator mVCO may be arranged identically to the offset current source and offset current sinks of the sample voltage-controlled oscillator sVCO_i. That is, among the respective offset current sources connected to the main voltage-controlled oscillator mVCO and the n sample voltage-controlled oscillators sVCO, all offset current sources disposed at the same position may have the same current magnitude. Likewise, among the respective offset current sinks connected to the main voltage-controlled oscillator mVCO and the n sample voltage-controlled oscillators sVCO, all offset current sinks disposed at the same position may have the same current magnitude.

As described above, the offset current setter 150 in accordance with one or more embodiments may output the sample offset current setting code sVCO_CON_i of the reference sample voltage-controlled oscillator 152, which is the sample voltage-controlled oscillator 152 having a frequency lower than and closest to the frequency of the input data signal Data, among the plurality of sample voltage-controlled oscillators 152 set to have different frequencies depending on the offset current setting values for the same control voltage Vctrl, and the main voltage-controlled oscillator 130 may use this code to set an offset current of the same magnitude as the offset current of the reference sample voltage-controlled oscillator 152, so that the main voltage-controlled oscillator 130 may start frequency synchronization in a state of being close to the frequency of the input data signal Data, thereby reducing the lock time.

One of more embodiments of the present disclosure provide reduced lock time of a phase locked loop (PLL).

Advantageous effects of the present disclosure are not limited to the above-mentioned effects, and various effects not mentioned herein may be included in the present specification.

Terms such as "include", "comprise", or "have" described above mean that the corresponding component can be present unless otherwise stated, and thus it should be construed that other components may be further included rather than excluding other components. All terms including technical or scientific terms have the same meaning as commonly understood by those of ordinary skill in the art to which the exemplary embodiments of the present disclosure belong, unless otherwise defined. Terms commonly used such as those defined in dictionaries should be interpreted as having a meaning that is consistent with their meaning in the context of the related art and will not be interpreted in an idealized or overly formal sense unless expressly so defined in the present disclosure.

The above description is merely illustrative of the technical idea of the present disclosure, and those of ordinary skill in the art to which the present disclosure pertains will be able to make various modifications and variations without departing from the essential characteristics of the present disclosure. Accordingly, the exemplary embodiments disclosed in the present disclosure are not intended to limit the technical idea of the present disclosure, but to explain the technical idea, and the scope of the technical idea of the present disclosure is not limited by these embodiments. The scope of protection of the present disclosure should be interpreted by the accompanying claims, and all technical ideas within the scope equivalent thereto should be construed as being included in the scope of the present disclosure.

What is claimed is:

1. A phase locked loop comprising:
a main voltage-controlled oscillator for which an oscillation frequency is adjusted by an offset current and a control voltage (Vctrl), the offset current being set by an offset current setting code (VCO_CON);
a phase frequency detector configured to adjust the control voltage by comparing an output signal (mCLK) of the main voltage-controlled oscillator and an input data signal (Data); and
an offset current setter configured to generate the offset current setting code for setting the offset current of the main voltage-controlled oscillator,
wherein the offset current setter comprises n sample voltage-controlled oscillators configured to generate n signals with different frequencies, respectively, and n counters configured to compare frequencies of each of the signals (sCLK) output from the n sample voltage-controlled oscillators and the input data signal, and is configured to generate the offset current setting code based on a comparison result of the n counters.

2. The phase locked loop of claim 1, wherein the offset current setter generates the offset current setting code so that the offset current of the main voltage-controlled oscillator is substantially same as an offset current of a reference sample voltage-controlled oscillator, and
the reference sample voltage-controlled oscillator is a sample voltage-controlled oscillator having a frequency lower than and closest to the frequency of the input data signal among the n sample voltage-controlled oscillators.

3. The phase locked loop of claim 2, wherein an oscillation frequency of each of the n sample voltage-controlled oscillators is adjusted by an offset current and a control voltage, a same control voltage of the main voltage-controlled oscillator is applied to the n sample voltage-controlled oscillators, and the offset current of each of the n sample voltage-controlled oscillators is set to a different value so that each of the n sample voltage-controlled oscillators oscillates at a different frequency.

4. The phase locked loop of claim 3, wherein respective offset currents of the n sample voltage-controlled oscillators are determined by preset n sample offset current setting codes (sVCO_CON), and the offset current setting code of the main voltage-controlled oscillator is set to the same value as the sample offset current setting code of the reference sample voltage-controlled oscillator by the offset current setter, so that the offset current of the main voltage-controlled oscillator is set to a value substantially equal to the offset current of the reference sample voltage-controlled oscillator.

5. The phase locked loop of claim 4, wherein the offset current setting code and the sample offset current setting code are n-bit codes.

6. The phase locked loop of claim 1, wherein each of the n counters counts in synchronization with the output signal (sCLK) of a corresponding sample voltage-controlled oscillator and is reset by a signal obtained by dividing the input data signal by $2^{n-1}$.

7. The phase locked loop of claim 6, wherein each of the n counters outputs an output value that is low or high depending on whether a count of $2^{n-1}$ is completed before being reset by a signal obtained by dividing the input data signal by $2^{n-1}$, and the offset current setting code is an n-bit code determined by the n output values output from the n counters.

8. The phase locked loop of claim 1, wherein the main voltage-controlled oscillator and each of the n sample voltage-controlled oscillators include n offset current sources and n offset current sinks, the n offset current sources and the n offset current sinks are each controlled to be turned on and off by corresponding switches, and corresponding pairs of the n offset current sources and the n offset current sinks are controlled to be turned on and off by a same signal.

9. The phase locked loop of claim 8, wherein the n offset current sources and the n offset current sinks of the main voltage-controlled oscillator are controlled to be turned on and off by respective bits of the offset current setting code.

* * * * *